United States Patent
Lin

(10) Patent No.: US 6,455,353 B2
(45) Date of Patent: Sep. 24, 2002

(54) METHOD OF MAKING SEMICONDUCTOR PACKAGES AT WAFER LEVEL

(75) Inventor: Chun Hung Lin, Kaohsiung (TW)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 09/925,688

(22) Filed: Aug. 10, 2001

(51) Int. Cl.⁷ .................................................. H01L 21/44
(52) U.S. Cl. ........................................ 438/113; 438/107
(58) Field of Search ................................ 438/113, 690, 438/25, 114, 107, 460, 464, 465

(56) References Cited

U.S. PATENT DOCUMENTS

| | | |
|---|---|---|
| 5,323,051 A | 6/1994 | Adams et al. |
| 5,879,964 A * | 3/1999 | Paik et al. .................. 438/113 |
| 5,925,936 A | 7/1999 | Yamaji |
| 6,004,867 A | 12/1999 | Kim et al. |
| 6,060,373 A * | 5/2000 | Saitoh .......................... 438/459 |
| 6,083,768 A * | 7/2000 | Jiang et al. ..................... 438/25 |
| 6,114,245 A * | 9/2000 | Vandamme et al. ......... 438/690 |
| 6,211,461 B1 * | 4/2001 | Park et al. .................. 174/52.4 |
| 6,376,278 B1 * | 4/2002 | Egawa et al. ............... 438/110 |

* cited by examiner

Primary Examiner—Hoai Ho
Assistant Examiner—David Vu

(57) ABSTRACT

A method of manufacturing chip scale packages at wafer level, comprising the steps of: a) providing a wafer having an active and a back side surface, the active surface of the wafer having a plurality of scribe lines defining individual chips, and each chip having a plurality of electrodes; b) forming a dam enclosing the perimeter of the wafer; c) filling the area enclosed by the dam with molding compound to encapsulate the active surface of the wafer; d) removing the dam to expose the scribe lines covered by the dam on the active surface of the wafer; and e) dicing the wafer according to the exposed scribe lines as positioning reference marks.

12 Claims, 3 Drawing Sheets

METHOD OF MAKING SEMICONDUCTOR PACKAGES AT WAFER LEVEL

BACKGROUND OF THE INVENTION

1. Field of the Invention

The present invention generally relates to a chip scale package (CSP), and more particularly, to a method of manufacturing chip scale package at wafer level for accurately dividing the wafer into individual chips.

2. Description of the Related Art

As electronic devices have become smaller and thinner, the velocity and the complexity of IC chip become more and more higher. Accordingly, a need has arisen for higher package efficiency. Demand for miniaturization is the primary catalyst driving the usage of advanced packages such as chip scale packages (CSP). As compared to the ball grid array (BGA) package and thin small outline package (TSOP), the chip scale package significantly increases the packaging efficiency and has several advantages. For example, the CSP package is slightly larger than the chip, and typically, the CSP is about 20 percent larger than the chip itself. Another advantage of CSP is that the package facilitates test and burn-in before assembly as an alternative to known good die(KGD) testing. In addition, CSP can combine many of the benefits of surface mount technology (SMT), such as standardization, encapsulation, surface mount, and re-workability, with the benefits of flip chip technology, such as low inductance, high I/O count, and direct thermal path.

However, CSP has at least one disadvantage compared to conventional BGA and TSOP, namely, high cost per unit. However, this problem could be eliminated if chip-sized packages could be mass produced more easily. Therefore, there is a need in the semiconductor packaging industry for CSP using mass production techniques at the wafer-level, as is illustrated in U.S. Pat. Nos. 5,323,051, 5,925,936 and 6,004,867.

For the methods of making the chip scale package at the wafer level disclosed in U.S. Pat. Nos. 5,323,051 and the U.S. Pat. No. 5,925,936, the methods substantially comprise the steps of: a) encapsulating an active surface of a wafer; b) grinding the encapsulated wafer to expose the bumps on the active surface of the wafer and to obtain the predetermined thickness; and c) dicing the encapsulated wafer according to the exposed bump as positioning reference marks.

In the above mentioned patents, because the scribe lines is covered by molding compound on the wafer surface after encapsulating, the exposed bumps are utilized as the positioning reference marks for dicing the encapsulated wafer. But the exposed bumps of the individual chip or dice is too tiny to provide an obvious positioning reference mark which is easily detected by the positioning device of the dicing machine or apparatus. Hence, the positioning device of the dicing machine or apparatus is often positioned in error.

U.S. Pat. No. 6,004,867, entitled "Chip-size Package Assembled Using Mass Production Techniques At The Wafer-Level" issued on Dec. 21, 1999 to Kim et al., discloses a chip-size package technique at wafer level, wherein a substrate is attached to an active surface of a packaged wafer, the substrate includes grooves or index patterns corresponding to the scribe lines, and the grooves or index patterns in the substrate will be exposed by grinding such that the exposed grooves or index patterns are utilized as positioning reference marks for dicing the wafer. However, according to the process of Kim's 867 Patent, the wafer requires additional attachment of the substrate for dicing, which fails to fulfill the requirements of chip scale package.

Hence, a need exists for a semiconductor package that provides a method of making the chip scale package at the wafer level to retain obvious scribe lines after the wafer is encapsulated by molding compound such that the dicing machine can be easily and accurately positioned in dicing process of the chip scale package so as to overcome the above mentioned drawback.

SUMMARY OF THE INVENTION

It is a primary object of the present invention to provide a method of manufacturing chip scale package at the wafer level for mass production so as to reduce the cost of manufacturing chip scale package. It is another object of the present invention to provide a method of manufacturing chip scale package at the wafer level to retain obvious scribe lines after the wafer is encapsulated by molding compound such that the dicing machine can be easily and accurately positioned in dicing process of the chip scale package.

In order to achieve the objects mentioned hereinabove, the method of manufacturing chip scale packages at wafer level according to an embodiment of the present invention comprises the step of:

a) providing a wafer having an active and a back side surface, the active surface of the wafer having a plurality of scribe lines to defining individual chips, and each chip having a plurality of electrodes;

b) forming a dam enclosing the perimeter of the wafer;

c) filling the area enclosed by the dam with molding compound to encapsulate the active surface of the wafer;

d) removing the dam to expose the covered scribe lines on the active surface of the wafer; and e) dicing the wafer according to the exposed scribe lines as positioning reference marks.

According to another embodiment of the present invention, the dam is form on the active surface of the wafer spaced a predetermined distance from the perimeter of the wafer to expose the scribe lines such that the scribe lines will be exposed without removing the dam. Therefore, since the method of manufacturing chip scale packages at wafer level according to the present invention will expose the scribe lines during the manufacturing process, the wafer can be accurately diced according to the exposed scribe lines as positioning reference marks.

BRIEF DESCRIPTION OF THE DRAWINGS

Other objects, advantages, and novel features of the invention will become more apparent from the following detailed description when taken in conjunction with the accompanying drawings.

FIG. 1b is a partially enlarged sectional view of the chip shown in FIG. 1a.

DETAILED DESCRIPTION OF THE PREFERRED EMBODIMENT

The present invention relates to a method of mass-producing chip scale package at wafer level so as to reduce the cost of manufacturing chip scale package. Now the preferable embodiments according to the present invention will be described in detail while taken in conjunction with the accompanying drawings. In the accompanying drawings, like reference numbers refer to corresponding parts throughout.

Figure 1A:
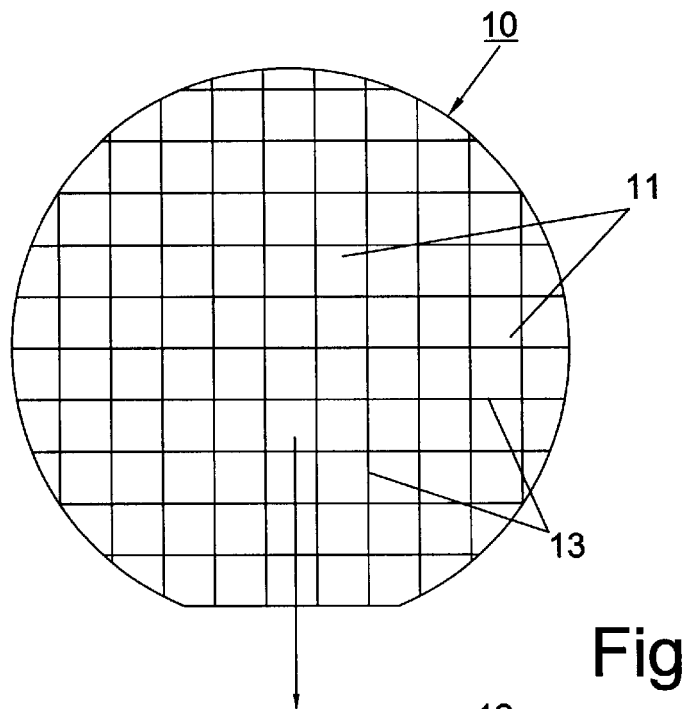
FIG. 1a plan view showing a wafer according to the present invention.
Figure 1B:
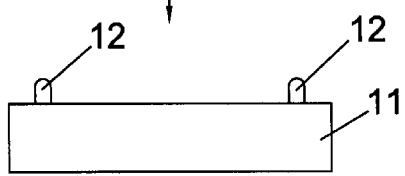

FIG. 1a depicts a top plan view of a wafer 10 according to the present invention. The wafer 10 has a plurality of chips 11 and a plurality of scribe lines 13 located between the chips 11. FIG. 1b is a partially enlarged sectional view of the chip 11 shown in FIG. 1a, in which each of the chips 11 is provided with a plurality of bumps or electrodes 12 on the active surface thereof. The electrodes 12 are formed by electroplating on the electrode terminals of the chips 11, and the electrodes 12 is made of conductive metal material, such as solder or gold, which can be connected with a substrate by soldering.

Figure 2:
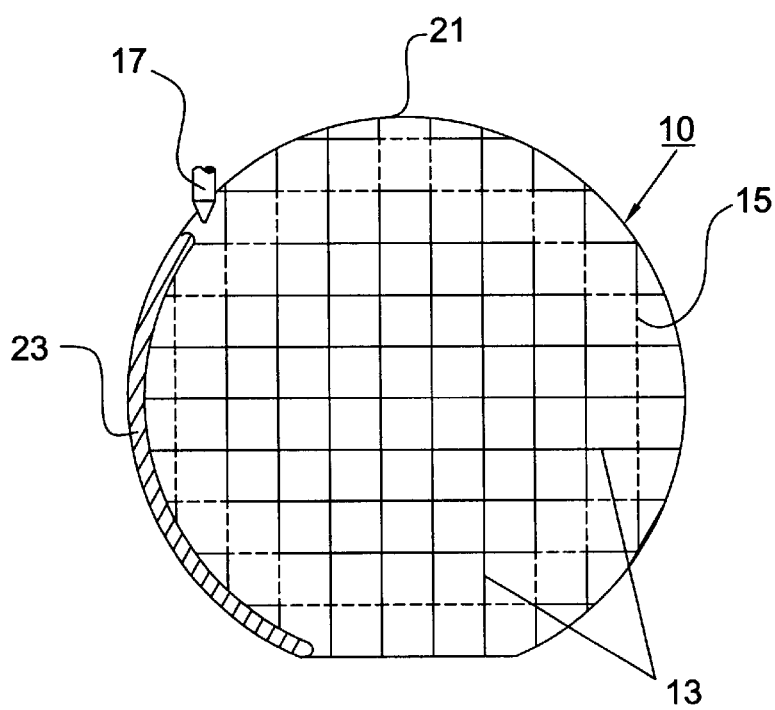
FIG. 2 is a schematic view showing the step of forming the dam enclosing the perimeter of the wafer according to a first embodiment of the present invention.

Now referring to FIG. 2, the area for effective chips of the wafer 10 is enclosed by dash lines 15 and a dispenser 17 is used to dispense the dam material along the perimeter 21 of the wafer 10 to form a dam 23 surrounding the perimeter 21 of the wafer 10. The material of the dam 23 will be selected to provide substantial viscosity and thixotropic, such as high viscosity epoxy, so as to control the aspect ratio of the dam 23. The typical aspect ratio of the dam 23 is 3:1. Once the material of dam 23 is selected, the dispensing speed of the dispenser 17 can be optimum and the dispensing speed will have some influences on the dam's aspect ratio.

Figure 3:
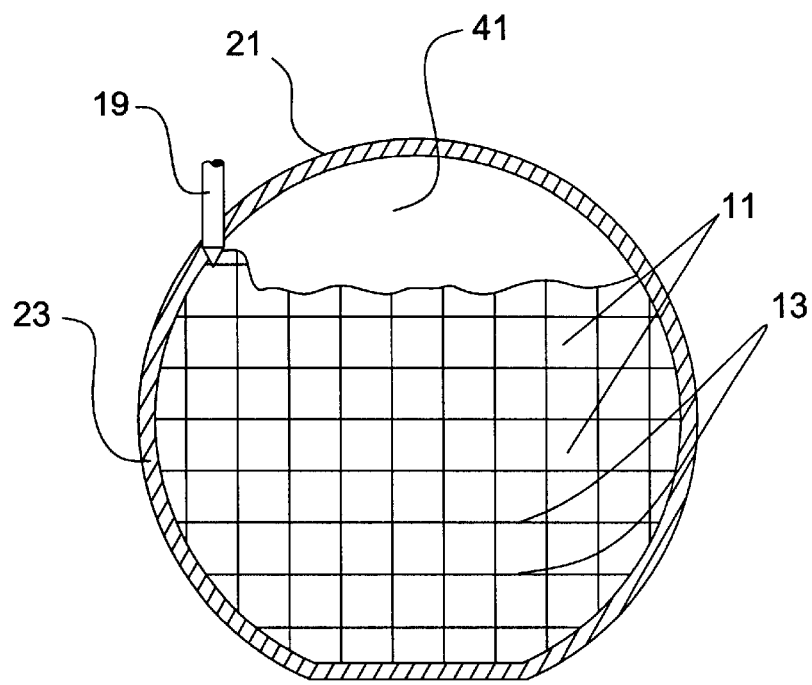
FIG. 3 is a schematic view showing the step of encapsulating the wafer with molding according the first embodiment of the present invention.

Referring to FIG. 3, after the dam 23 encloses the entire perimeter 21 of the wafer 10, another dispenser 19 will be provided to dispense the molding compound 41. The molding compound 41 has lower viscosity and contains less filler particles so as to fill the area enclosed by the dam 23 and cover the electrodes 12 to encapsulate the wafer 10. It will be appreciated by those skilled in this art that the molding compound 41 can be applied onto the active surface of the wafer 10 by other manners. For example, the spin coating method can be used to dispense the molding compound 41 on the rotating wafer 10 and the active surface of the wafer 10 will be uniformly encapsulated with the molding compound 41 by means of the centrifugal force of the rotation of the wafer 10.

Figure 4:
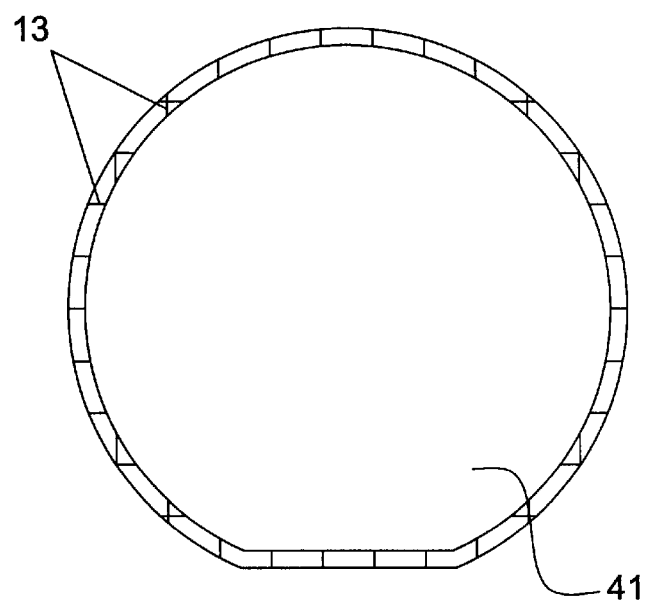
FIG. 4 is a schematic view showing the wafer after the dam being removed according to the first embodiment of the present invention.

It should be noted that, according to the embodiment of the present invention, after the molding compound 41 and the dam 23 are cured, a separating interface will form therebetween, and thus the dam 23 can be removed easily from the wafer 10 and the molding compound 41 can retain its integrity for encapsulating the wafer 10 (as shown in FIG. 4).

Referring to FIG. 4, after the dam 23 is removed, the scribe lines 13 covered by the dam 23 on the perimeter 21 of the wafer 10 will be exposed. Therefore, the cutting tools can accurately dice the wafer 10 to form individual chips 11 according to the exposed scribe lines 13 as positioning reference marks. It should be appreciated by those skilled in this art that before the wafer 10 is diced, the molding compound 41 and the back side surface of the wafer 10 shall be ground to expose the electrodes 12 and to make the thickness of the wafer 10 to be within a predetermined range.

Figure 5:
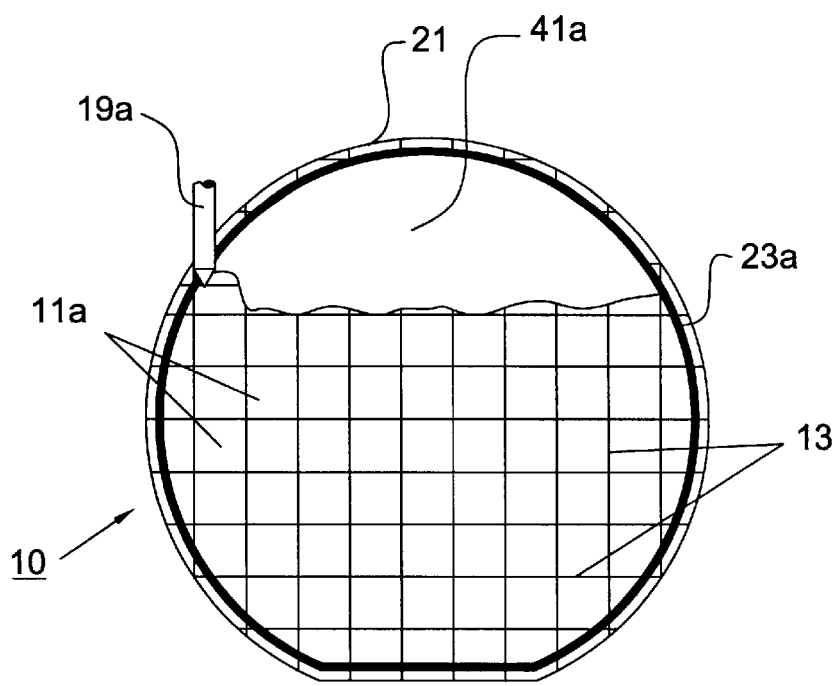
FIG. 5 is a schematic view showing the step of encapsulating the wafer with molding according to a second embodiment of the present invention.
Figure 6:
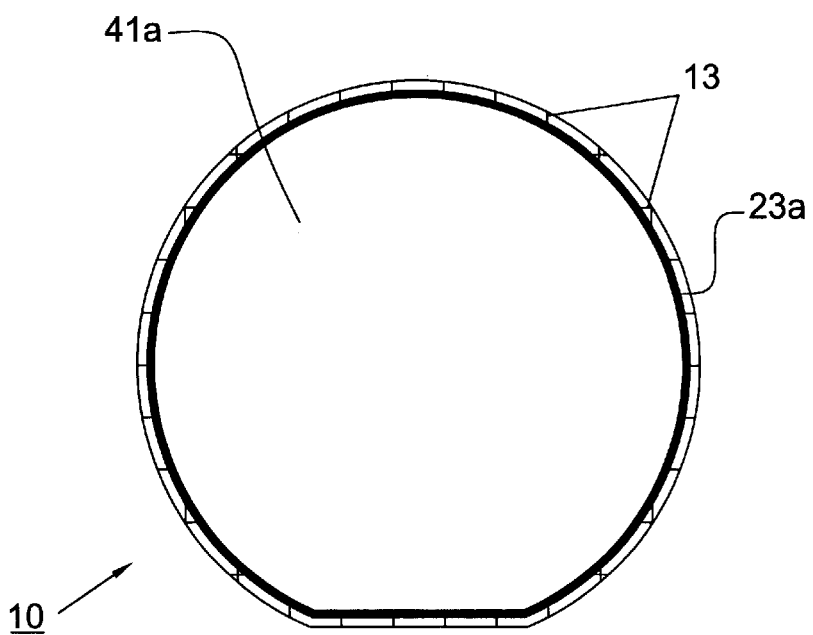
FIG. 6 is a schematic view showing the wafer after the dam being removed according to the second embodiment of the present invention.

Now referring to FIG. 5 and 6, they depict a manufacturing process according to the second embodiment of the present invention which is generally similar to the first embodiment of the present invention and where the similar parts are indicated by similar reference characters. The difference between the first and the second embodiments lies in that the aspect ratio of the dam 23a of the second embodiment is smaller than that of the dam 23 of the first embodiment, i.e., the ratio of the width to height on the cross section of the dam 23a is smaller than that on the dam 23. The width of the dam 23a is smaller than that of the dam 23 while the height of the dam 23 and the height of the dam 23a are the same (as shown in FIG. 5). Therefore, the dam 23a will not filly cover the perimeter 21 of the wafer 10 and will encircle the wafer 10 with a distance spaced from the perimeter 21.

As shown in FIG. 6, the wafer 10 is further encapsulated by the molding compound 41a. Since the dam 23a is spaced from the perimeter 21 of the wafer 10, the scribe lines 13 will not be covered after encapsulated by molding compound 41a, and thus the wafer 10 can be accurately diced to form individual chips 11 according to the scribe lines 13 as positioning reference marks.

Similarly, it also will be appreciated that the wafer of this embodiment still shall be ground to expose the electrodes 12 and to make the thickness of the wafer 10 to be within a predetermined range.

As described hereinabove, the present invention provides a method of manufacturing chip scale package at wafer level in which the scribe lines can still be keep visibly after the chip scale package at wafer level is encapsulated by the molding compound so as to accurately dice the wafer to form individual chips according to the scribe lines as positioning reference marks. Therefore, the method according to the present invention can be used to mass-produce chip scale package at wafer level to reduce the cost of manufacturing chip scale package.

Although the invention has been explained in relation to its preferred embodiment, it is to be understood that many other possible modifications and variations can be made without departing from the spirit and scope of the invention as hereinafter claimed.

What is claimed is:

1. A method of manufacturing chip scale packages at wafer level, comprising the steps of:
    a) providing a wafer having an active and a back side surface, the active surface of the wafer having a plurality of scribe lines defining individual chips, and each chip having a plurality of electrodes;
    b) forming a dam enclosing the perimeter of the wafer;
    c) filling the area enclosed by the dam with molding compound to encapsulate the active surface of the wafer;
    d) removing the dam to partly expose the scribe lines previously covered by the dam on the active surface of the water; and
    e) dicing the wafer to form individual chips using the partly exposed scribe lines as positioning reference marks.

2. The method of manufacturing chip scale packages at wafer level as claimed in claim 1, wherein the dam is made from a high viscosity and thixotropy material.

3. The method of manufacturing chip scale packages at wafer level as claimed in claim 1, wherein the ratio of the width to height on the cross section of the dam is 3:1.

4. The method of manufacturing chip scale packages at wafer level as claimed in claim 1, further comprising a step of:
grinding the molding compound on the wafer to expose the electrodes out of the molding compound.

5. The method of manufacturing chip scale packages at wafer level as claimed in claim 1, further comprising a step of:
grinding the back side of the wafer to a thickness within a predetermined range.

6. The method of manufacturing chip scale packages at wafer level as claimed in claim 1, wherein the molding compound is filled by spin coating process to encapsulate the active surface of the wafer.

7. A method of manufacturing chip scale packages at wafer level, comprising the steps of:
a) providing a wafer having an active and a back side surface, the active surface of the wafer having a plurality of scribe lines defining individual chips, and each chip having a plurality of electrodes;
b) forming a dam spaced a predetermined distance from the perimeter of the wafer to partly expose the scribe lines;
c) filling the area enclosed by the dam with molding compound to encapsulate the active surface of the wafer; and
d) dicing the wafer using the partly exposed scribe lines as positioning reference marks.

8. The method of manufacturing chip scale packages at wafer level as claimed in claim 7, wherein the dam is made from a high viscosity and thixotropy material.

9. The method of manufacturing chip scale packages at wafer level as claimed in claim 1, wherein the ratio of the width to height on the cross section of the dam is 3:1.

10. The method of manufacturing chip scale packages at wafer level as claimed in claim 7, further comprising a step of:
grinding the molding compound on the wafer to expose the electrodes out of the molding compound.

11. The method of manufacturing chip scale packages at wafer level as claimed in claim 7, further comprising a step of:
grinding the back side of the wafer to a thickness within a predetermined range.

12. The method of manufacturing chip scale packages at wafer level as claimed in claim 7, wherein the molding compound is filled by spin coating process to encapsulate the active surface of the wafer.

* * * * *